(12) United States Patent
Yan et al.

(10) Patent No.: US 8,035,123 B2
(45) Date of Patent: Oct. 11, 2011

(54) HIGH LIGHT-EXTRACTION EFFICIENCY LIGHT-EMITTING DIODE STRUCTURE

(75) Inventors: Liang-Jyi Yan, Taipei County (TW); Chang-Han Chiang, Taichung (TW); Yea-Chen Lee, Hsinchu County (TW); Chih-Sung Chang, Hsinchu County (TW)

(73) Assignee: High Power Opto. Inc., Taichung County (TW)

( * ) Notice: Subject to any disclaimer, the term of this patent is extended or adjusted under 35 U.S.C. 154(b) by 111 days.

(21) Appl. No.: 12/411,816

(22) Filed: Mar. 26, 2009

(65) Prior Publication Data
US 2010/0243985 A1     Sep. 30, 2010

(51) Int. Cl.
*H01L 33/00* (2010.01)
(52) U.S. Cl. .................. 257/98; 257/E33.068
(58) Field of Classification Search ............ 257/79–103, 257/E33.067, E33.068, E33.069
See application file for complete search history.

(56) References Cited

U.S. PATENT DOCUMENTS

| | | | |
|---|---|---|---|
| 6,806,112 B1 * | 10/2004 | Horng et al. | 438/29 |
| 2003/0077847 A1 * | 4/2003 | Yoo | 438/22 |
| 2005/0156185 A1 * | 7/2005 | Kim et al. | 257/99 |
| 2006/0071219 A1 * | 4/2006 | Wojnarowski et al. | 257/79 |

* cited by examiner

*Primary Examiner* — Ha Tran T Nguyen
*Assistant Examiner* — Kevin Quinto
(74) *Attorney, Agent, or Firm* — Muncy, Geissler, Olds & Lowe, PLLC

(57) ABSTRACT

The present invention discloses a high light-extraction efficiency LED structure, wherein metallic pads and metallic mesh wires made of an aluminum-silver alloy are formed on an LED, whereby the high-reflectivity aluminum-silver alloy makes the light incident on the metallic pads and metallic mesh wires reflected once more or repeatedly and then emitted from the surface or lateral side of the LED, wherefore the present invention can decrease the light loss and increase the light-extraction efficiency.

3 Claims, 3 Drawing Sheets

HIGH LIGHT-EXTRACTION EFFICIENCY LIGHT-EMITTING DIODE STRUCTURE

FIELD OF THE INVENTION

The present invention relates to a light-emitting diode structure, particularly to a high light-extraction efficiency light-emitting diode structure.

BACKGROUND OF THE INVENTION

Refer to FIG. 1 for a conventional light-emitting diode (LED), wherein an N-type gallium nitride layer (n-GaN) 2, a multi-layer quantum well (MQW) 3, a P-type gallium nitride (p-GaN) 4 are sequentially epitaxially grown on a substrate 1; then a P-type metallic pad (p-Pad) 5 and an N-type metallic pad (n-Pad) 6 are coated on the abovementioned epitaxial layers. If the LED is to be used as a high-power and large-size LED, metallic mesh wires 7 and 8 are simultaneously coated on the epitaxial layers during coating the P-type metallic pad 5 and the N-type metallic pad 6. For a high-power and large-size LED, a high-reflectivity reflecting layer 9 is further coated on the grinded and polished substrate 1 to increase the brightness of the LED by reflection.

In a high-power and large-size LED, the P-type metallic pad 5, the N-type metallic pad 6 and the metallic mesh wires 7 and 8 are usually uniformly distributed on the light-emitting region and occupy a considerable area. The conventional P-type metallic pad 5, N-type metallic pad 6 and metallic mesh wires 7 and 8 are usually made of indium tin oxide (ITO), nickel/gold, or chromium/gold. However, ITO has a problem of peel-off and is likely to react with silver. When cooperating with silver, the nickel/gold or chromium/gold has a reflectivity of only 50-60%, absorbs a considerable amount of light, and results in an unneglectable light loss, which not only decreases the brightness of LED but also generates waste heat. Thus, the service life of LED is decreased by high temperature.

SUMMARY OF THE INVENTION

The primary objective of the present invention is to fabricate stable, high-reflectivity and peeling-free metallic pads and metallic mesh wires on LED, whereby light is reflected and conducted by the metallic pads and metallic mesh wires to leave LED, wherefore the light loss is decreased and the light extraction efficiency is increased.

To achieve the abovementioned objective, the present invention proposes a high light-extraction efficiency light-emitting diode structure, which comprises an LED epitaxial layer and at least one electric-conduction layer made of an aluminum-silver alloy formed on the LED epitaxial layer. As the aluminum-silver alloy has a high reflectivity in the visible spectra, the electric-conduction layer absorbs less light and reflects more light. Thus is promoted the light extraction efficiency of LED.

Via promoting the light extraction efficiency, the present invention can increase the brightness, decrease waste heat, lower the temperature, and prolong the service life of LED.

DETAILED DESCRIPTION OF THE PREFERRED EMBODIMENTS

The technical contents of the present invention will be described in detail with the embodiments. However, it should be understood that the embodiments are only to exemplify the present invention but not to limit the scope of the present invention.

Figure 1:
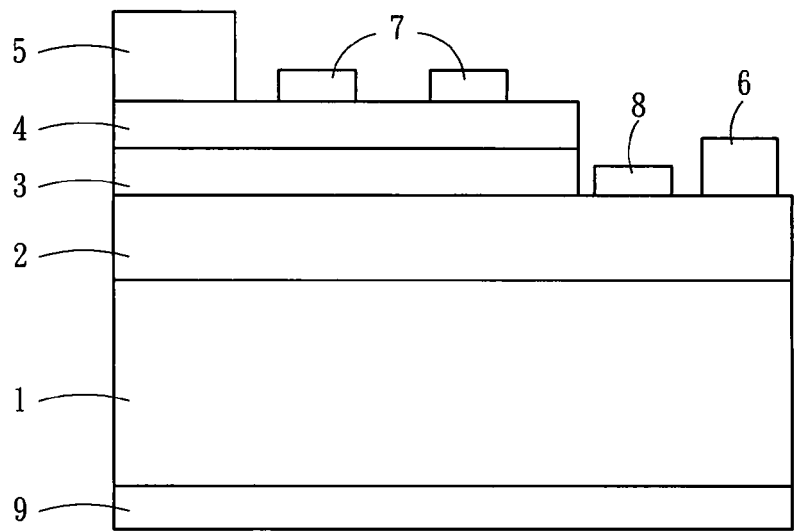
FIG. 1 is a diagram schematically showing the structure of a conventional LED.
Figure 2:
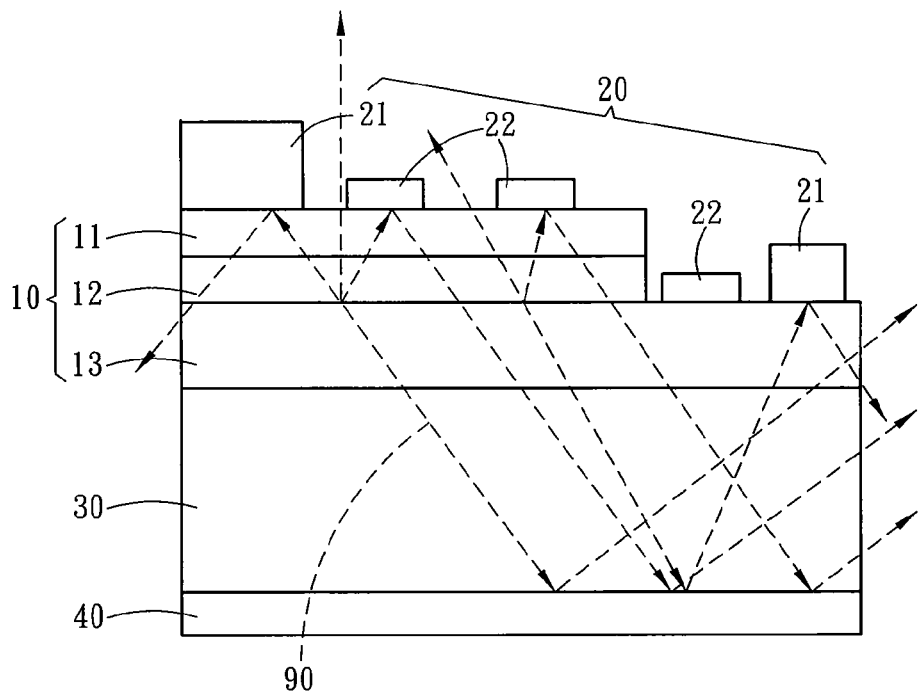
FIG. 2 is a diagram schematically showing a high light-extraction efficiency LED structure according to a first embodiment of the present invention.

Refer to FIG. 2 for a first embodiment of the present invention. In the first embodiment, the high light-extraction efficiency light-emitting diode structure of the present invention comprises an LED epitaxial layer 10 and at least one electric-conduction layer 20 formed over the LED epitaxial layer 10. The LED epitaxial layer 10 includes a hole supply layer 11, an active layer 12 and an electron supply layer 13, which are stacked sequentially. The electric-conduction layer 20 is fabricated via forming an aluminum layer having a thickness of 10-50 nm and a silver layer having a thickness of 80-500 nm and tempering the two layers at a high temperature to form an aluminum-silver alloy. The electric-conduction layer 20 can be fabricated to have the forms of metallic pads 21 and metallic mesh wires 22.

The electron supply layer 13 is formed on a sapphire substrate 30 and has an area larger than the active layer 12 and the hole supply layer 11 respectively have so that the electric-conduction layer 20 can be formed on the hole supply layer 11 and the electron supply layer 13. The sapphire substrate 30 has a reflective metal layer 40 on the side far away from the LED epitaxial layer 10.

The active layer 13 includes a multi-layer quantum well formed of a periodic structure of an aluminum indium gallium nitride. The electron supply layer 13 is made of an N-type gallium nitride or an N-type indium gallium nitride. The hole supply layer 11 is made of a P-type gallium nitride or a P-type indium gallium nitride.

Figure 3:
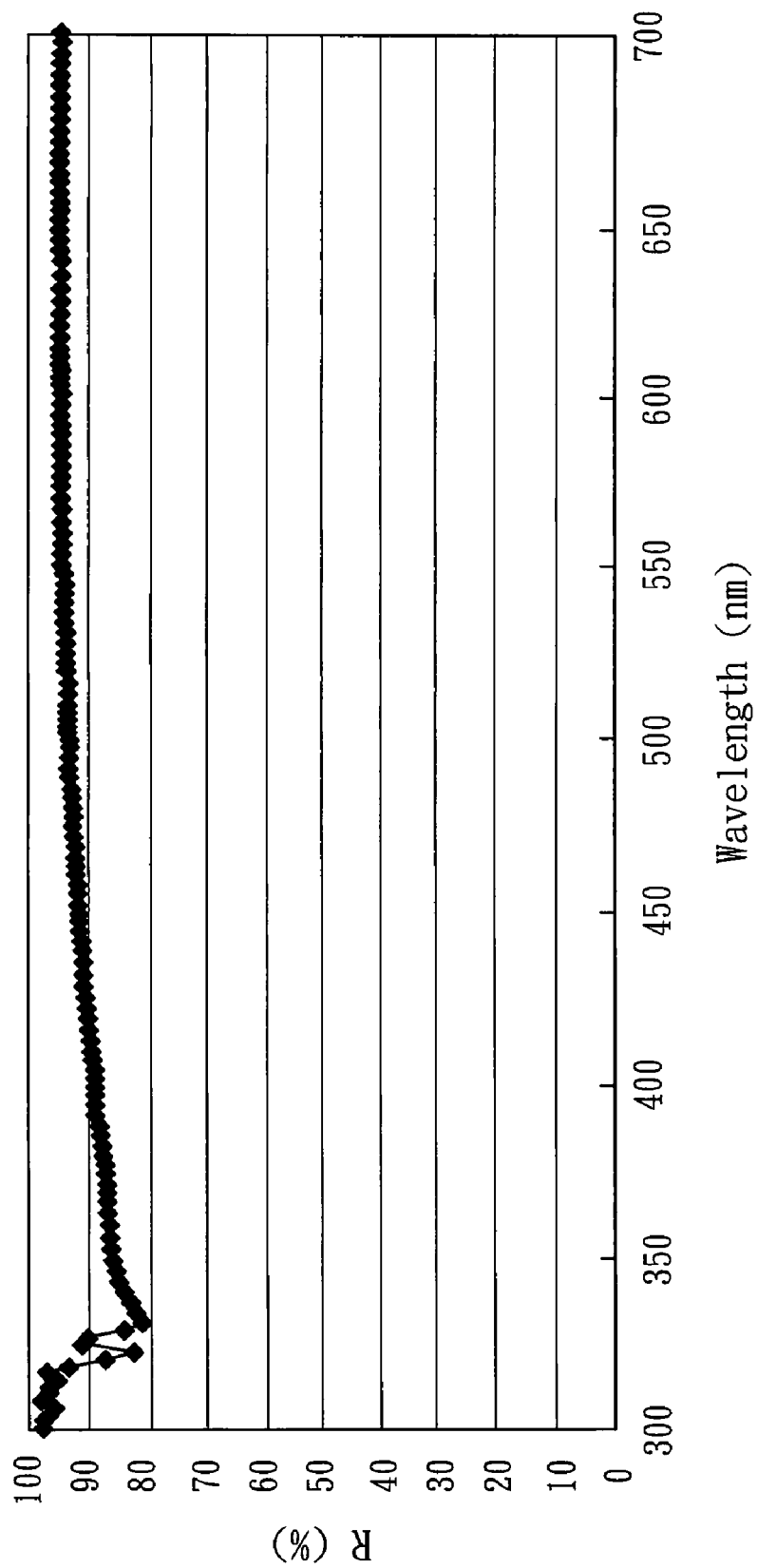
FIG. 3 is a diagram schematically showing the relationship of wavelength and reflectivity of an aluminum silver alloy.

Refer to FIG. 3, a diagram schematically showing the relationship of wavelength and reflectivity of an aluminum-silver alloy. It can be observed in FIG. 3 that the aluminum-silver alloy has a superior reflectivity in the visible spectra. Thus, light 90 generated by the active layer 12 will be reflected by the electric-conduction layer 20 (the metallic pads 21 and the metallic mesh wires 22) and then further reflected by the reflective metal layer 40 and finally emitted from the lateral side. Thereby, the loss of the light 90 is decreased, and the light extraction efficiency thereof is increased.

Figure 4:
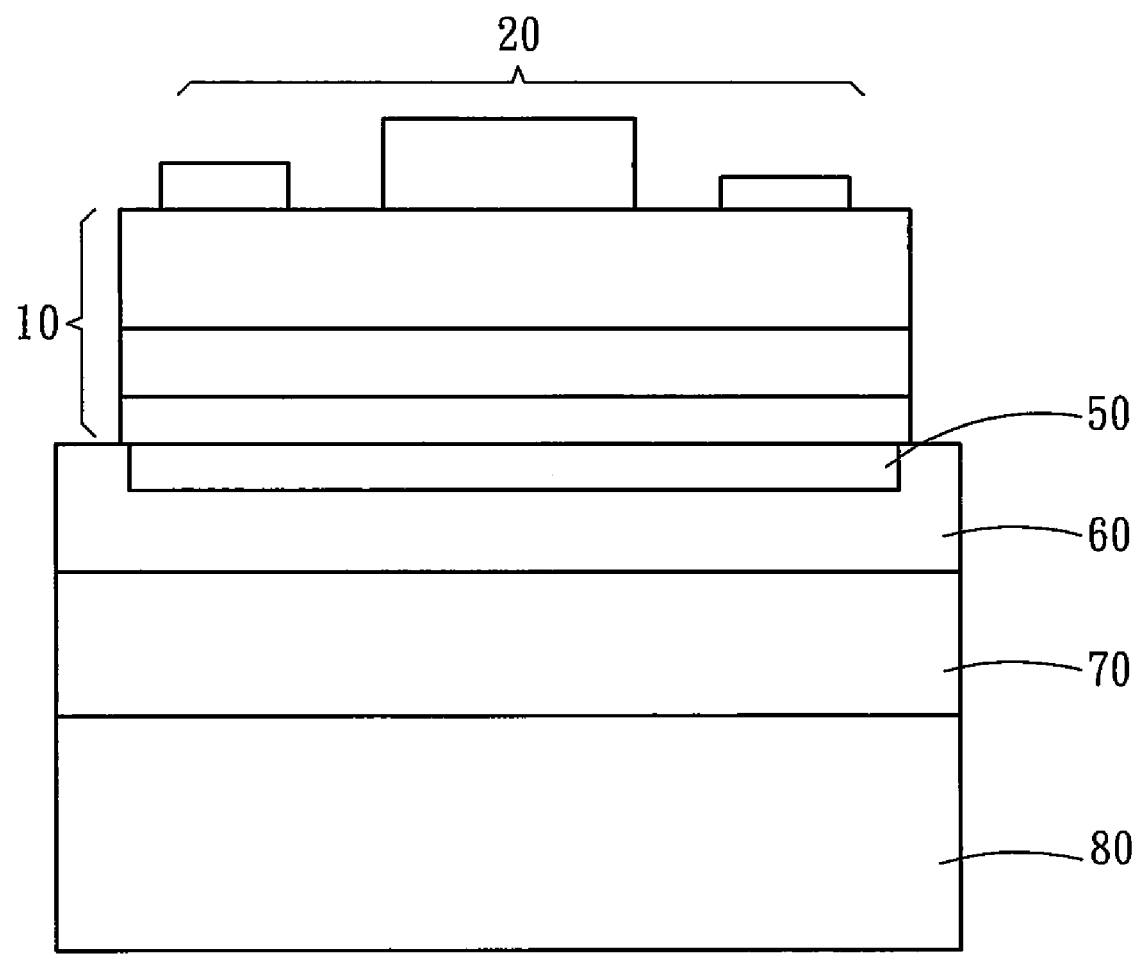
FIG. 4 is a diagram schematically showing a high light-extraction efficiency LED structure according to a second embodiment of the present invention.

Refer to FIG. 4 for a second embodiment of the present invention. In the second embodiment, the high light-extraction efficiency light-emitting diode structure of the present invention comprises an LED epitaxial layer 10 and at least one electric-conduction layer 20 made of an aluminum-silver alloy and formed over the LED epitaxial layer 10, wherein the electric-conduction layer 20 is arranged on one side of the LED epitaxial layer 10, and an ohmic contact layer 50 is arranged on another side of the LED epitaxial layer 10, which is far away from the electric-conduction layer 20. The ohmic contact layer 50 is made of an aluminum-silver alloy and formed on an electric-conduction metal layer 60. The electric-conduction metal layer 60 is bonded to a silicon substrate 80 via an adhesion layer 70.

In the second embodiment, as the ohmic contact layer 50 is made of a high-reflectivity aluminum-silver alloy and very close to the active layer 12, the light generated by the active layer 12 will be reflected by the ohmic contact layer 50 after it passes through a very short distance. Thus, the light loss is decreased, and the light extraction efficiency is increased.

In the present invention, the electric-conduction layer 20 made of an aluminum-silver alloy having superior reflectivity in the visible spectra, whereby the light loss is decreased and the light extraction efficiency is increased. The aluminum-silver alloy also has a superior ohmic characteristic. The ohmic contact layer 50 made of the aluminum-silver alloy not only has a superior electric conductivity but also has a high reflectivity. Thus is further increased the light extraction efficiency.

What is claimed is:

1. A high light-extraction efficiency light-emitting diode structure, comprising:
   a substrate;
   a light-emitting diode epitaxial layer, including an electron supply layer formed on the substrate, an active layer formed on the electron supply layer, and a hole supply layer formed on the active layer, the electron supply layer having an area larger than the active layer and the hole supply layer;
   a plurality of electric-conduction layers made of an aluminum-silver alloy, including metallic pads formed on the electron supply layer and the hole supply layer respectively, and mesh wires formed on the electron supply layer and the hole supply layer respectively; and
   a reflective metal layer formed on one side of the substrate opposite to the light-emitting diode epitaxial layer, wherein the metallic pads, the metallic mesh wires and the reflective metal layer reflect light generated by the active layer.

2. The high light-extraction efficiency light-emitting diode structure according to claim 1, wherein said active layer includes a multi-layer quantum well formed of a periodic structure of an aluminum indium gallium nitride; said electron supply layer is made of an N-type gallium nitride or an N-type indium gallium nitride; said hole supply layer is made of a P-type gallium nitride or a P-type indium gallium nitride.

3. The high light-extraction efficiency light-emitting diode structure according to claim 1, wherein said aluminum-silver alloy is fabricated via forming an aluminum layer having a thickness of 10-50 nm and a silver layer having a thickness of 80-500 nm and tempering said aluminum layer and said silver layer at a high temperature.

* * * * *